(12) United States Patent
Guo

(10) Patent No.: US 12,620,734 B2
(45) Date of Patent: May 5, 2026

(54) OPTOELECTRONIC COMPONENT, NETWORK DEVICE, AND METHOD FOR MANUFACTURING OPTOELECTRONIC COMPONENT

(71) Applicant: Huawei Technologies Co., Ltd., Shenzhen (CN)

(72) Inventor: Ying Guo, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 846 days.

(21) Appl. No.: 17/957,587

(22) Filed: Sep. 30, 2022

(65) Prior Publication Data

US 2023/0017638 A1     Jan. 19, 2023

Related U.S. Application Data

(63) Continuation of application No. PCT/CN2021/076107, filed on Feb. 8, 2021.

(30) Foreign Application Priority Data

Mar. 31, 2020   (CN) .......................... 202010242637.7

(51) Int. Cl.
| | |
|---|---|
| *H01R 12/71* | (2011.01) |
| *H01R 13/24* | (2006.01) |
| *H01R 43/20* | (2006.01) |
| *H05K 7/20* | (2006.01) |

(52) U.S. Cl.
CPC ....... H01R 12/714 (2013.01); H01R 13/2414 (2013.01); H01R 43/205 (2013.01); H05K 7/20127 (2013.01)

(58) Field of Classification Search
CPC .......................... H01R 12/714; H05K 7/20127
USPC .......................................................... 439/71
See application file for complete search history.

(56) References Cited

U.S. PATENT DOCUMENTS

| | | | | |
|---|---|---|---|---|
| 3,998,512 | A | | 12/1976 | Anhalt et al. |
| 4,144,648 | A | * | 3/1979 | Grovender .......... H01L 23/4828 |
| | | | | 439/71 |
| 4,165,607 | A | * | 8/1979 | Fedorowicz ........... G04G 17/02 |
| | | | | 968/878 |
| 4,357,061 | A | * | 11/1982 | Crosby .................. H05K 3/325 |
| | | | | 349/149 |
| 5,163,834 | A | * | 11/1992 | Chapin .............. H01R 13/2435 |
| | | | | 439/86 |

(Continued)

FOREIGN PATENT DOCUMENTS

| | | |
|---|---|---|
| CN | 203324541 U | 12/2013 |
| CN | 108051893 A | 5/2018 |

(Continued)

*Primary Examiner* — Neil Abrams

(74) *Attorney, Agent, or Firm* — Conley Rose, P.C.

(57) ABSTRACT

An optoelectronic component includes an optical module and a host circuit board. The optical module includes a module circuit board and a gold finger that is located on a first surface of the module circuit board. The host circuit board includes a conductive elastomer corresponding to the gold finger and that is located on a first surface of the host circuit board. The module circuit board is located on the host circuit board, the first surface of the module circuit board and the first surface of the host circuit board face each other, and the gold finger is in contact with the conductive elastomer.

20 Claims, 2 Drawing Sheets

(56) References Cited

U.S. PATENT DOCUMENTS

| | | | | |
|---|---|---|---|---|
| 5,265,329 A * | 11/1993 | Jones | ...................... | H01L 24/32 |
| | | | | 439/91 |
| 5,309,324 A * | 5/1994 | Herandez | ............. | H05K 1/0206 |
| | | | | 361/811 |
| 5,358,412 A * | 10/1994 | Maurinus | ........... | G02F 1/13452 |
| | | | | 349/150 |
| 6,439,895 B1 * | 8/2002 | Li | ........................... | G02B 6/43 |
| | | | | 439/71 |
| 6,887,109 B2 * | 5/2005 | Hofmeister | .......... | H01R 12/716 |
| | | | | 439/71 |
| 7,344,383 B1 * | 3/2008 | Lu | ........................ | G02B 6/4284 |
| | | | | 439/71 |
| 7,556,504 B2 * | 7/2009 | Ryu | ........................ | H10F 77/50 |
| | | | | 439/70 |
| 7,766,558 B2 * | 8/2010 | Fukutomi | .............. | G02B 6/428 |
| | | | | 385/88 |
| 8,047,856 B2 * | 11/2011 | McColloch | .......... | G02B 6/4246 |
| | | | | 439/71 |
| 8,366,458 B2 * | 2/2013 | Ngo | ..................... | H01R 12/727 |
| | | | | 439/79 |
| 8,382,384 B2 * | 2/2013 | Nekado | ................ | G02B 6/4249 |
| | | | | 385/14 |
| 9,274,295 B2 * | 3/2016 | Droesbeke | .......... | G02B 6/4261 |
| 11,125,956 B2 * | 9/2021 | Zbinden | .............. | G02B 6/4283 |
| 2002/0191374 A1 * | 12/2002 | Yatougo | ............. | H05K 7/20145 |
| | | | | 165/80.3 |

FOREIGN PATENT DOCUMENTS

| | | | |
|---|---|---|---|
| CN | 109411957 A | 3/2019 |
| EP | 0524430 A1 | 1/1993 |

* cited by examiner

OPTOELECTRONIC COMPONENT, NETWORK DEVICE, AND METHOD FOR MANUFACTURING OPTOELECTRONIC COMPONENT

CROSS-REFERENCE TO RELATED APPLICATIONS

This application is a continuation of International Patent Application No. PCT/CN2021/076107 filed on Feb. 8, 2021, which claims priority to Chinese Patent Application No. 202010242637.7 filed on Mar. 31, 2020. The disclosures of the aforementioned applications are hereby incorporated by reference in their entireties.

TECHNICAL FIELD

This application relates to the field of optical communication technologies, and in particular, to an optoelectronic component, a network device, and a method for manufacturing the optoelectronic component.

BACKGROUND

An optoelectronic component is generally an integrated component used for optical-to-electrical conversion. For example, the optoelectronic component may convert an optical signal into an electrical signal, or convert an electrical signal into an optical signal, and plays an important role in the field of optical communication.

The optoelectronic component may include an optical module, a host circuit board, and the like. A module circuit board of the optical module is electrically connected to the host circuit board. For example, golden fingers (also referred to as gold fingers) may be disposed on two opposite surfaces of the module circuit board, and a connector with conductive elastomers inside may be installed on the host circuit board. When the optical module is installed on the host circuit board, the module circuit board may be inserted into the connector, so that the golden fingers on the module circuit board are in contact with the conductive elastomers in the connector, and electrical connection is implemented.

In a related technology, the connector on the host circuit board is high, and occupies high space of the optoelectronic component.

SUMMARY

Embodiments of this application provide an optoelectronic component, a network device, and a method for manufacturing the optoelectronic component, to overcome problems of a related technology. The technical solutions are as follows.

In one aspect, an optoelectronic component is provided, where the optoelectronic component includes an optical module and a host circuit board.

The optical module includes a module circuit board and a golden finger, where the golden finger is located on a first surface of the module circuit board. The host circuit board includes a conductive elastomer corresponding to the golden finger, where the conductive elastomer is located on a first surface of the host circuit board.

The module circuit board is located on the host circuit board, the first surface of the module circuit board and the first surface of the host circuit board face each other, and the golden finger is in contact with the conductive elastomer.

The golden finger includes many golden-yellow conductive contact sheets, and the conductive elastomer may be a metal sheet with a thin thickness, for example, may be a thin copper sheet.

In some embodiments, the optical module may be installed on the host circuit board, and the first surface of the module circuit board of the optical module is close to the first surface of the host circuit board. For example, the first surface of the module circuit board is in contact with the first surface of the host circuit board. The golden finger on the module circuit board is in contact with the conductive elastomer on the host circuit board, to implement electrical connection between the optical module and the host circuit board.

The golden finger on the module circuit board is disposed on one surface of the module circuit board instead of two opposite surfaces of the module circuit board. In this way, the conductive elastomer in contact with the golden finger is also disposed on one surface of the host circuit board. Therefore, the conductive elastomer is located only on one side of the module circuit board, and is not located on two sides of the module circuit board. Therefore, height space occupied by the conductive elastomer is small. Because the height space occupied by the conductive elastomer is small, some space is available for installing another component, or may be used to dispose an air duct, or the like.

In an example, the height space occupied by the conductive elastomer is small, so that an air duct that passes through a first end and an opposite second end of the optical module may be formed. The air duct that passes through the first end and the second end of the optical module is formed, and convection is formed. This helps enhance a heat dissipation effect of the optical module.

In an example, the height space occupied by the conductive elastomer is small, so that a side that is of the optical module and that is away from the module circuit board may be used as expansion space for installing another component during subsequent expansion. In comparison with installing another component at an end of the optical module, installing another component on one side of the optical module is more helpful for heat dissipation. This is because the end of the optical module is an end of the optoelectronic component, and the end of the optoelectronic component usually dissipates heat using natural wind in a data equipment room, and a heat dissipation effect is usually poor. However, a heat sink is installed inside the optoelectronic component, and the heat dissipation effect is better especially at a position closer to the heat sink.

In a possible implementation, there is the air duct that passes through the first end and the opposite second end of the optical module.

One port of the air duct is located at the first end of the optical module, and the other port of the air duct is located at the second end of the optical module.

In solutions shown in some embodiments of this application, the height space occupied by the conductive elastomer is small, so that the air duct that passes through the first end and the opposite second end of the optical module may be formed. The air duct that passes through the first end and the second end of the optical module is formed, and the convection is formed. This helps enhance the heat dissipation effect of the optical module.

In a possible implementation, the optoelectronic component further includes the heat sink, and the heat sink is located on a second surface of the module circuit board.

In solutions shown in some embodiments of this application, a baseplate of the heat sink is installed on the module circuit board, so that heat generated by the module circuit board can be transferred to the heat sink, and the heat is dissipated through the heat sink.

In a possible implementation, a thermally conductive layer is installed between the module circuit board and the heat sink.

In solutions shown in some embodiments of this application, the thermally conductive layer is filled between the module circuit board and the heat sink. The thermally conductive layer may be flexible. One surface of the thermally conductive layer is in contact with the module circuit board, and the other surface is in contact with the heat sink, to eliminate a gap between the module circuit board and the heat sink, ensure good heat transfer between the module circuit board and the heat sink, accelerate heat transfer between the module circuit board and the heat sink, and accelerate heat dissipation for the optical module.

In a possible implementation, the side that is of the optical module and that is away from the module circuit board may be used as the expansion space for installing another component.

In the solutions shown in some embodiments of this application, the side that is of the optical module and that is away from the module circuit board may be used as the expansion space for installing another component. For example, a heat sink may be installed, or a chip may be installed.

In a possible implementation, a plurality of rows of golden fingers are disposed on the first surface of the module circuit board, a plurality of rows of conductive elastomers are disposed on the first surface of the host circuit board, and each row of golden fingers corresponds to one row of conductive elastomers.

In solutions shown in some embodiments of this application, the golden finger corresponds to the conductive elastomer. For example, a quantity of golden fingers is equal to a quantity of conductive elastomers, and a position of the golden finger is consistent with a position of the conductive elastomer. For example, as shown in FIG. 1, two rows of golden fingers are disposed on the module circuit board, and two rows of conductive elastomers may be disposed on the host circuit board. When the module circuit board is installed on the host circuit board, each golden finger may contact one row of conductive elastomers. The electrical connection between the module circuit board and the host circuit board is implemented through contact between the golden finger and the conductive elastomer.

In a possible implementation, a connector is installed on the host circuit board, the connector is located between the module circuit board and the host circuit board, and the conductive elastomer is located in the connector.

In solutions shown in some embodiments of this application, the connector is installed on the host circuit board, the connector is located between the module circuit board and the host circuit board, and the conductive elastomer is located in the connector. The connector occupies small height space, and the connector may be located between the module circuit board and the host circuit board. In comparison with a related technology in which the module circuit board is inserted into a connector, the connector in this embodiment is only on one side of the module circuit board, so that space on the other side of the module circuit board is available, and another component may be installed in the space on the other side of the module circuit board, for example, a heat sink or a chip.

In a possible implementation, the golden finger is disposed at a position close to the end of the module circuit board.

In solutions shown in some embodiments of this application, the golden finger may be disposed at the position close to the end of the module circuit board, and the conductive elastomer on the host circuit board may also be disposed at a position close to the end of the host circuit board. In this way, when the optical module is installed, the module circuit board may be pushed to a bottom of the host circuit board, and the golden finger on the module circuit board may be in contact with the conductive elastomer on the host circuit board.

In a possible implementation, a hole digging structure used to enhance heat dissipation exists on the optical module.

In solutions shown in some embodiments of this application, the optical module may use a hole digging technology, and the hole digging structure used to enhance the heat dissipation may be disposed on the optical module. For example, a hollow-out structure may be disposed on a housing of the optical module.

In a possible implementation, the optical module is an optical receiving module, an optical sending module, an optical transceiver integral module, or an optical forwarding module.

In solutions shown in some embodiments of this application, the optical module may be an optical receiving module, an optical sending module, an optical transceiver integral module, or an optical forwarding module. A specific type of the optical module is not limited in the embodiments.

According to another aspect, a method for manufacturing an optoelectronic component is provided, where the optoelectronic component is any one of the foregoing optoelectronic components, and the method includes installing a golden finger on a first surface of a module circuit board of an optical module, and installing a conductive elastomer on a first surface of a host circuit board, and installing the optical module on the first surface of the host circuit board, where the first surface of the module circuit board faces the first surface of the host circuit board, and the golden finger is in contact with the conductive elastomer.

In solutions shown in some embodiments of this application, the golden finger may be disposed on the first surface of the module circuit board of the optical module, and a quantity of golden fingers is not limited. For example, a row of golden fingers may be disposed, or a plurality of rows of golden fingers may be disposed. Each row of golden fingers may include a plurality of golden fingers. The quantity of golden fingers is not limited, and may be flexibly selected based on an actual requirement.

In some embodiments, the conductive elastomer corresponding to the golden finger is installed on the first surface of the host circuit board, where a quantity of conductive elastomers corresponds to the quantity of golden fingers on the module circuit board. In addition, a spacing between two adjacent golden fingers also adapts to a spacing between two adjacent conductive elastomers, so that the golden fingers correspond one-to-one to the conductive elastomers.

In this way, after the optical module is installed on the first surface of the host circuit board, the first surface of the module circuit board and the first surface of the host circuit board face each other. For example, the first surface of the module circuit board is in contact with or has a small spacing from the first surface of the host circuit board, the golden finger on the module circuit board is in contact with the conductive elastomer on the host circuit board, and the module circuit board is electrically connected to the host circuit board through contact between the golden finger and the conductive elastomer.

The golden fingers are disposed on one surface of the module circuit board, instead of being disposed on two opposite surfaces, so that the conductive elastomers on the host circuit board are located only on one surface, instead of on two opposite surfaces, and the conductive elastomers are located only on one side of the module circuit board, instead of having conductive elastomers on both sides of the module circuit board. In this way, space on one side of the module circuit board is available for installing another component, and the like. For example, another component may be installed on the second surface of the module circuit board, and an air duct may be further disposed above the second surface of the module circuit board.

In a possible implementation, the method further includes disposing, in the optical module, an air duct that passes through a first end and a second end of the optical module.

In solutions shown in some embodiments of this application, one port of the air duct is located at the first end of the optical module, and the other port of the air duct is located at the second end of the optical module. In this way, a heat dissipation capability of the optical module can be improved by adding the air duct, and heat dissipation of the optical module can be accelerated.

In a possible implementation, the method further includes installing a heat sink on the second surface of the module circuit board.

In solutions shown in some embodiments of this application, a heat dissipation effect can be greatly improved by using the heat sink installed on the module circuit board and the disposed air duct, and the heat dissipation of the optical module can be accelerated.

In a possible implementation, a thermally conductive layer is installed between the second surface of the module circuit board and the heat sink.

In solutions shown in some embodiments of this application, the thermally conductive layer may be flexible. One surface of the thermally conductive layer is in close contact with the heat sink, and the other surface is in close contact with the second surface of the module circuit board. Therefore, heat on the module circuit board may be quickly transferred to the heat sink, and the heat on the module circuit board is reduced through the heat sink to dissipate heat for the optical module.

In a possible implementation, installing a golden finger on a first surface of a module circuit board of the optical module includes installing a connector on the first surface of the host circuit board, where the conductive elastomer exists in the connector, and the conductive elastomer extends out of the connector, and installing the optical module on the first surface of the host circuit board includes installing the optical module on the connector, where the golden finger on the module circuit board is in contact with the conductive elastomer extending out of the connector.

In solutions shown in some embodiments of this application, the conductive elastomer may be first installed in the connector, and one end of the conductive elastomer extends out of the connector, to be in contact with the golden finger. In this way, the connector may be installed on the first surface of the host circuit board, and then the module circuit board of the optical module is installed on the connector, so that the connector is clamped between the host circuit board and the module circuit board.

According to still another aspect, an embodiment of this application provides a network device. The network device includes any one of the foregoing optoelectronic components.

In comparison with that a module circuit board is inserted into a connector, in this embodiment, a height of the connector is small, the connector is located only on a first surface of the module circuit board, and does not occupy space on a second surface of the module circuit board, so that another component may be installed in the space on the second surface of the module circuit board, and the connector does not affect disposing of an air duct that passes through one end to the other end.

In solutions shown in some embodiments of this application, the optoelectronic component may include an optical module and a host circuit board. The optical module includes a module circuit board and a golden finger, and the golden finger is located on a first surface of the module circuit board. The host circuit board includes a conductive elastomer corresponding to the golden finger, and the conductive elastomer is located on a first surface of the host circuit board. The module circuit board is located on the host circuit board, the first surface of the module circuit board and the first surface of the host circuit board face each other, so that the golden finger is in contact with the conductive elastomer, to implement electrical connection between the optical module and the host circuit board. The golden finger is disposed on one surface of the module circuit board, and the conductive elastomer is disposed on one surface of the host circuit board. In comparison with that the conductive elastomers are disposed on two surfaces of the host circuit board, height space occupied by the conductive elastomer in this application is small. When the height space occupied by the conductive elastomer is small, two opposite ends of the optical module may be disposed with an air duct that passes through the two opposite ends, and space is available on the module circuit board to install a heat sink, so that a heat dissipation effect of the optoelectronic component can be improved.

REFERENCE NUMERALS

1: Optical module; 2: Host circuit board; 3: Connector; 4: Air duct; 11: Module circuit board; 12: Golden finger; and 21: Conductive elastomer.

DESCRIPTION OF EMBODIMENTS

Embodiments of this application relate to an optoelectronic component. The optoelectronic component is a component configured to perform optical-to-electrical conversion. For example, the optoelectronic component may convert an optical signal into an electrical signal, or convert an electrical signal into an optical signal.

Figure 1:
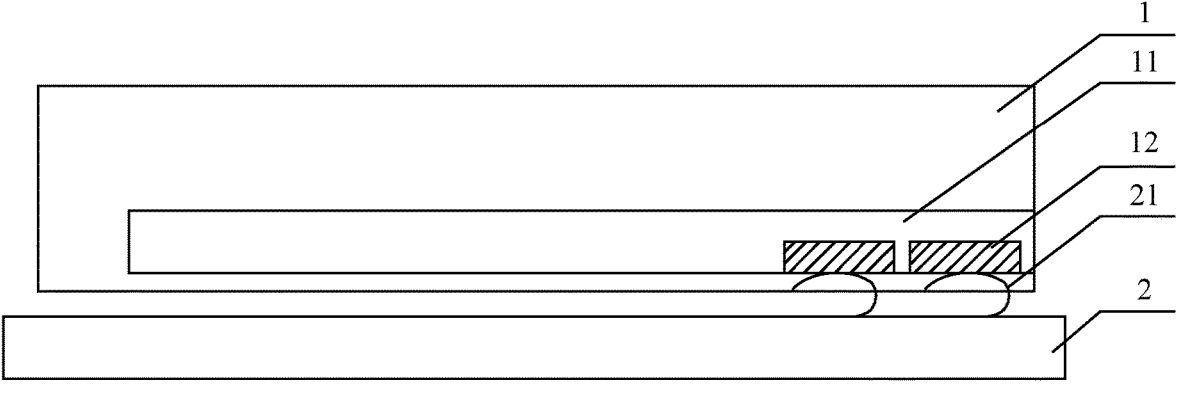
FIG. 1 is a schematic diagram of a structure of an optoelectronic component according to an embodiment of this application.

FIG. 1 is a schematic diagram of a structure of an optoelectronic component. The optoelectronic component may include an optical module 1 and a host circuit board 2. The optical module 1 may include a module circuit board 11 and a golden finger 12. The golden finger 12 is located on a first surface of the module circuit board 11. The host circuit board 2 may include a conductive elastomer 21 corresponding to the golden finger. The conductive elastomer 21 is located on a first surface of the host circuit board 2. When the optical module 1 is located on the host circuit board 2, the first surface of the module circuit board 11 is close to the first surface of the host circuit board 2, in other words, the first surface of the module circuit board 11 and the first surface of the host circuit board 2 face each other, so that the golden finger 12 is in electrical contact with the conductive elastomer 21. In some embodiments, the host circuit board 2 and the conductive elastomer 21 may be independent components.

The optical module 1 may be an optical receiving module, an optical sending module, an optical transceiver integral module, or an optical forwarding module. A specific type of the optical module is not limited in the embodiments.

The module circuit board 11 and the host circuit board 2 may be printed circuit boards (PCBs).

The golden finger 12 includes many golden-yellow conductive contact sheets. Because a surface of the golden finger 12 is gold-plated and the conductive contact sheets are arranged in a finger shape, the golden finger 12 is referred to as a golden finger. The conductive elastomer 21 may be a metal sheet with a thin thickness, for example, may be a thin copper sheet.

The first surface of the module circuit board 11 and the first surface of the host circuit board 2 are surfaces of the module circuit board 11 and the host circuit board 2 facing each other.

In an example, the optical module 1 may be installed on the host circuit board 2, and the first surface of the module circuit board 11 of the optical module 1 is close to the first surface of the host circuit board 2. For example, the first surface of the module circuit board 11 is in contact with the first surface of the host circuit board 2. The golden finger 12 on the module circuit board 11 is in contact with the conductive elastomer 21 on the host circuit board 2, to implement electrical connection between the optical module 1 and the host circuit board 2.

It can be learned from FIG. 1 that, the golden finger 12 on the module circuit board 11 is disposed on one surface of the module circuit board 11 instead of two opposite surfaces of the module circuit board 11. In this way, the conductive elastomer 21 in contact with the golden finger 12 is also disposed on one surface of the host circuit board 2. Therefore, the conductive elastomer 21 is located only on one side of the module circuit board 11, and is not located on two sides of the module circuit board 11. Therefore, height space occupied by the conductive elastomer 21 is small.

Because the height space occupied by the conductive elastomer 21 is small, some space is available for installing another component, or may be used to dispose an air duct, or the like.

Figure 2:
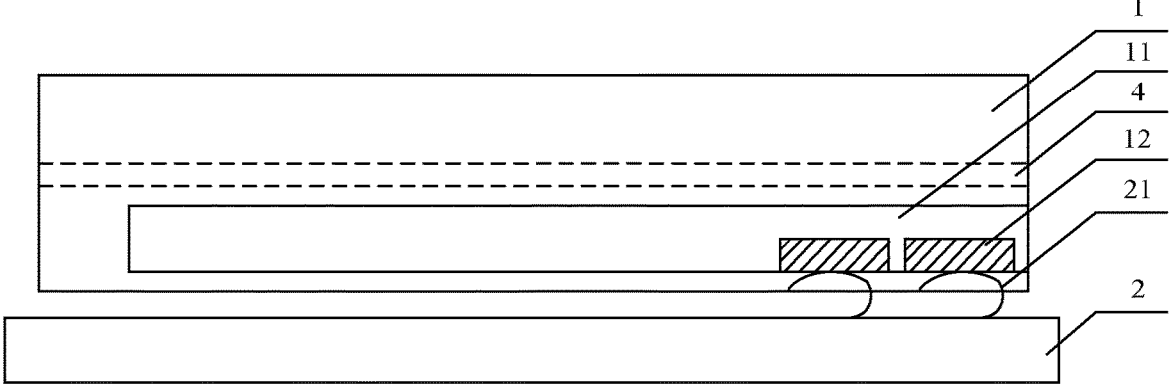
FIG. 2 is a schematic diagram of a structure of an optoelectronic component according to an embodiment of this application.

In an example, the height space occupied by the conductive elastomer 21 is small, as shown in FIG. 2, so that an air duct 4 that is in the optical module 1 and passes through a first end 5 and an opposite second end 6 of the optical module 1 may be formed. One port of the air duct is located at the first end 5 of the optical module, the other port of the air duct is located at the second end 6 of the optical module, and the air duct 4 that passes through the first end 5 and the second end 6 of the optical module 1 is formed, so that convection may be formed, and this helps enhance a heat dissipation effect of the optical module 1.

In an example, the height space occupied by the conductive elastomer 21 is small, so that a side that is of the optical module 1 and that is away from the module circuit board 11 may be used as expansion space for installing another component during subsequent expansion.

In comparison with installing another component at an end of the optical module 1, installing another component on one side of the optical module 1 is more helpful for heat dissipation. This is because the end of the optical module 1 is an end of the optoelectronic component, and the end of the optoelectronic component usually dissipates heat using natural wind in a data equipment room, and a heat dissipation effect is usually poor. However, a heat sink 22 is installed inside the optoelectronic component, and a heat dissipation effect is better especially at a position closer to the heat sink 22.

To further improve a heat dissipation effect of the optoelectronic component, the heat sink 22 may be installed on the second surface of the module circuit board 11.

In an example, the heat sink 22 may be installed on the second surface of the module circuit board 11, and heat generated on the module circuit board 11 may be dissipated through the heat sink 22 on the module circuit board 11.

The second surface of the module circuit board 11 is a surface opposite to the first surface of the module circuit board 11.

To accelerate heat dissipation of the optical module 1, a thermally conductive layer 14 may be installed between the module circuit board 11 and the heat sink 22. The thermally conductive layer 14 is filled between the module circuit board 11 and the heat sink 22. The thermally conductive layer 14 may be flexible. One surface of the thermally conductive layer 14 is in contact with the module circuit board 11, and the other surface is in contact with the heat sink 22, to eliminate a gap between the module circuit board 11 and the heat sink 22, ensure good heat transfer between the module circuit board 11 and the heat sink 22, accelerate heat transfer between the module circuit board 11 and the heat sink 22, and accelerate the heat dissipation for the optical module 1.

In an example, to accelerate the heat dissipation of the optical module 1, the optical module 1 may use a hole digging technology, and a hole digging structure used to enhance the heat dissipation may be disposed on the optical module 1. For example, a hollow-out structure may be disposed on a housing of the optical module 1.

In an example, there may be a plurality of golden fingers 12. Correspondingly, a plurality of rows of golden fingers 12 may be disposed on the first surface of the module circuit board 11, a plurality of rows of conductive elastomers 21 may also be disposed on the first surface of the host circuit board 2, and each row of golden fingers 12 corresponds to one row of conductive elastomers 21.

The golden finger 12 corresponds to the conductive elastomer 21. For example, a quantity of golden fingers 12 is equal to a quantity of conductive elastomers 21, and the golden finger 12 corresponds one-to-one to the conductive elastomer 21. For example, each row of golden fingers 12 may alternatively include a plurality of golden fingers 12, and correspondingly, each row of conductive elastomers 21 may also include a plurality of conductive elastomers. In an example, each row of golden fingers 12 may include four golden fingers, and each row of conductive elastomers 21 may also include four conductive elastomers.

Figure 3:
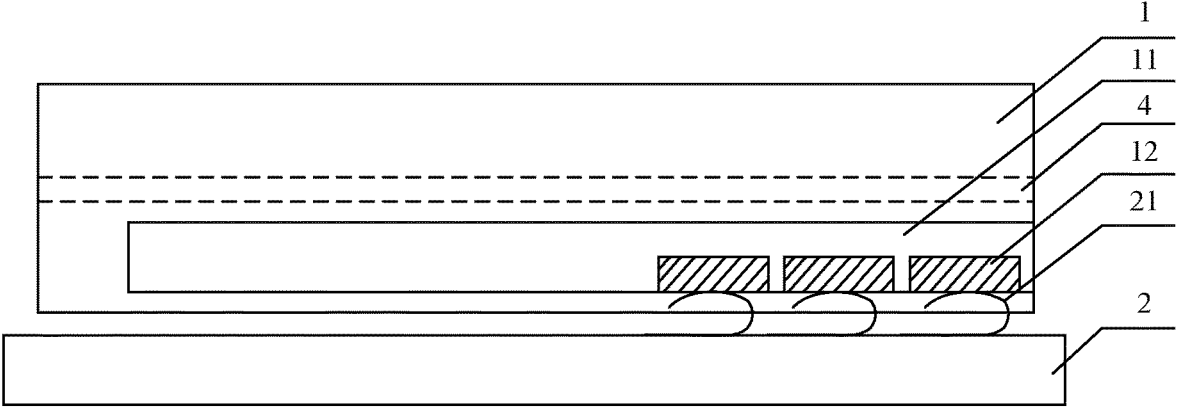
FIG. 3 is a schematic diagram of a structure of an optoelectronic component according to an embodiment of this application.

For example, as shown in FIG. 1 and FIG. 2, two rows of golden fingers 12 are disposed on the first surface of the module circuit board 11, two rows of conductive elastomers 21 are also disposed on the first surface of the host circuit board 2, and each row of golden fingers 12 corresponds to one row of conductive elastomers 21. For another example, as shown in FIG. 3, three rows of golden fingers 12 are disposed on the first surface of the module circuit board 11, and three rows of conductive elastomers 21 are disposed on the first surface of the host circuit board 2. A quantity of rows of golden fingers 12 and a quantity of golden fingers 12 in each row are not limited in this embodiment, and may be flexibly disposed based on an actual requirement.

A spacing between two adjacent golden fingers in each row of golden fingers adapts to a spacing between two adjacent conductive elastomers in each row of conductive elastomers. For example, the spacings are equal, so that the golden fingers and the conductive elastomers are in a one-to-one correspondence, to implement one-to-one contact.

In an example, as shown in FIG. 1 to FIG. 3, the golden finger 12 may be disposed at a position close to the end of the module circuit board 11, and the conductive elastomer 21 on the host circuit board 2 may also be disposed at a position close to the end of the host circuit board 2. In this way, when the optical module 1 is installed, the module circuit board 11 may be pushed to a bottom of the host circuit board 2, and the golden finger 12 on the module circuit board 11 may be in contact with the conductive elastomer 21 on the host circuit board 2.

Figure 4:
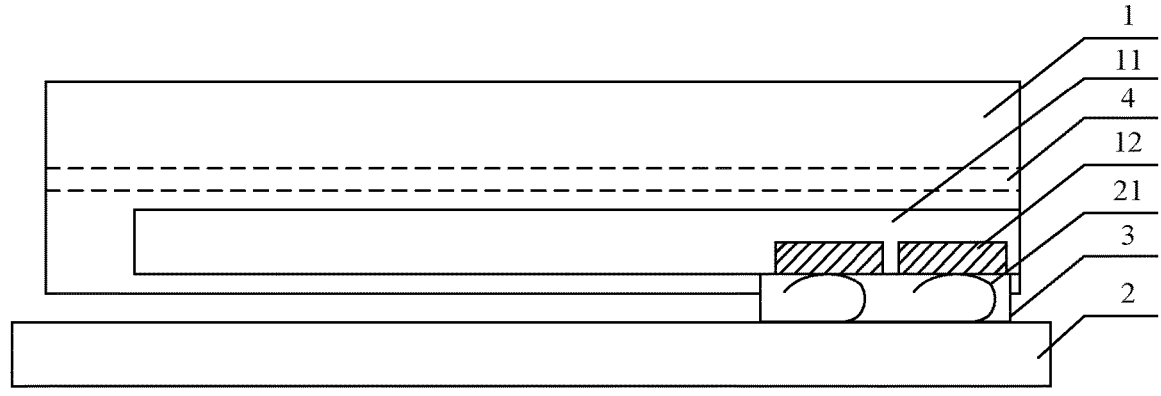
FIG. 4 is a schematic diagram of a structure of an optoelectronic component according to an embodiment of this application.

In an example, the conductive elastomer 21 may also be located in a connector, and the module circuit board 11 is inserted into the connector to implement contact between the golden finger 12 and the conductive elastomer 21. As shown in FIG. 4, a connector 3 is installed on the host circuit board 2, the connector 3 is located between the module circuit board 11 and the host circuit board 2, and the conductive elastomer 21 is located in the connector 3 and extends out of the connector 3 to be in contact with the golden finger 12.

As shown in FIG. 4, the connector 3 occupies small height space, and may be located between the module circuit board 11 and the host circuit board 2. In comparison with a related technology in which the module circuit board 11 is inserted into a connector, the connector 3 in this embodiment is only on one side of the module circuit board 11, so that space on the other side of the module circuit board 11 is available for installing another component, for example, a heat sink or a chip.

In some embodiments, the optoelectronic component may be an independent component, including a housing. The optical module 1, the host circuit board 2, and the heat sink may all be located in the housing. To improve the heat dissipation effect, a hole digging design may also be used for the housing of the optoelectronic component, and a hollow-out structure used for heat dissipation is disposed on the housing.

In some embodiments, the optoelectronic component may alternatively be used as a component in an optical communication device, and is located in a housing of the optical communication device.

Whether the optoelectronic component is an independent component or a component in the optical communication device is not limited in this embodiment.

In some embodiments, the optoelectronic component may include an optical module and a host circuit board. The optical module includes a module circuit board and a golden finger, and the golden finger is located on a first surface of the module circuit board. The host circuit board includes a conductive elastomer corresponding to the golden finger, and the conductive elastomer is located on a first surface of the host circuit board. The module circuit board of the optical module is installed on the host circuit board, the first surface of the module circuit board and the first surface of the host circuit board face each other, so that the golden finger is in contact with the conductive elastomer, to implement electrical connection between the optical module and the host circuit board. It can be learned that, the golden finger is disposed on one surface of the module circuit board, and the conductive elastomer is disposed on one surface of the host circuit board. In comparison with that the conductive elastomers are disposed on two surfaces of the host circuit board, height space occupied by the conductive elastomer in this application is small. When the height space occupied by the conductive elastomer is small, two opposite ends of the optical module may be disposed with an air duct that passes through the two opposite ends, and space is available on the module circuit board to install a heat sink, so that the heat dissipation effect of the optoelectronic component can be improved.

An embodiment of this application provides a network device. The network device includes any one of the foregoing optoelectronic components. A host circuit board 2 may be a primary circuit board of the network device, and a module circuit board belongs to a secondary circuit board of the network device.

An embodiment of this application further provides a method for manufacturing an optoelectronic component. The method may include installing a golden finger 12 on a first surface of a module circuit board 11 of an optical module 1, installing a conductive elastomer 21 on a first surface of a host circuit board 2, and installing the optical module 1 on the first surface of the host circuit board 2.

The first surface of the module circuit board 11 faces the first surface of the host circuit board 2, and the golden finger 12 is in contact with the conductive elastomer 21.

In some embodiments, the golden finger 12 may be disposed on the first surface of the module circuit board 1 of the optical module 1. For example, the golden finger 12 may be disposed on the first surface that is of the module circuit board 1 and that is close to an end. A quantity of golden fingers 12 is not limited. For example, a row of golden fingers may be disposed, or a plurality of rows of golden fingers may be disposed. Each row of golden fingers may include a plurality of golden fingers. The quantity of golden fingers is not limited, and may be flexibly selected based on an actual requirement.

In some embodiments, the conductive elastomer 21 corresponding to the golden finger is installed on the first surface of the host circuit board 2, where a quantity of conductive elastomers 21 corresponds to the quantity of golden fingers 12 on the module circuit board 11. For example, the quantity of golden fingers 12 is one row, and each row includes four golden fingers. Correspondingly, the quantity of conductive elastomers 21 is also one row, and each row also includes four conductive elastomers. In addition, a spacing between two adjacent golden fingers also adapts to a spacing between two adjacent conductive elastomers 21, so that the golden fingers 12 correspond one-to-one to the conductive elastomers 21.

In this way, after the optical module 1 is installed on the first surface of the host circuit board 2, the first surface of the module circuit board 11 and the first surface of the host circuit board 2 face each other. For example, the first surface of the module circuit board 11 is in contact with or has a small spacing from the first surface of the host circuit board 2, the golden finger 12 on the module circuit board 11 is in contact with the conductive elastomer 21 on the host circuit board 2, and the module circuit board 11 is electrically connected to the host circuit board 2 through contact between the golden finger 12 and the conductive elastomer 21.

The golden fingers 12 are disposed on one surface of the module circuit board 11, instead of being disposed on two opposite surfaces, so that the conductive elastomers 21 on the host circuit board 2 are located only on one surface, instead of on two opposite surfaces, and the conductive elastomers 21 are located only on one side of the module circuit board 11, instead of having conductive elastomers 21 on both sides of the module circuit board 11. In this way, space on one side of the module circuit board 11 is available for installing another component. For example, another component may be installed on the second surface of the module circuit board 11, and an air duct may be further disposed above the second surface of the module circuit board 11.

In some embodiments, because only the first surface of the module circuit board 11 has the golden finger 12, the conductive elastomer 21 on the host circuit board 2 does not extend to the second surface of the module circuit board 11. Therefore, in the optical module 1, an air duct 4 that passes through a first end 5 and a second end 6 of the optical module 1 may be disposed at a position above the second surface of the module circuit board 11, that is, a port of the air duct 4 is located at the first end 5 of the optical module, the other port of the air duct 4 is located at the second end 6 of the optical module. In this way, a heat dissipation capability of the optical module 1 can be improved by adding the air duct 4, and heat dissipation of the optical module 1 can be accelerated.

In some embodiments, at the position above the second surface of the module circuit board 11, not only the air duct 4 may be added, but also a heat sink 22 may be installed. Correspondingly, the method may further include installing the heat sink 22 on the second surface of the module circuit board 11.

In this way, the heat dissipation effect can be greatly improved through the heat sink 22 installed on the module circuit board 11 and the disposed air duct 4, and the heat dissipation of the optical module 1 can be accelerated.

In some embodiments, to further contact the module circuit board 11 and the heat sink 22, correspondingly, the method may further include installing a thermally conductive layer 14 between the second surface of the module circuit board 11 and the heat sink 22. The thermally conductive layer 14 may be flexible. One surface of the thermally conductive layer 14 is in close contact with the heat sink 22, and the other surface is in close contact with the second surface of the module circuit board 11. Further, heat on the module circuit board 11 may be quickly transferred to the heat sink 22, and the heat on the module circuit board 11 is reduced by using the heat sink 22 to dissipate heat for the optical module.

To protect the conductive elastomer 21, the conductive elastomer 21 may be located in a connector. Correspondingly, the method may include installing the connector 3 on the first surface of the host circuit board 2, where the conductive elastomer 21 exists in the connector 3, and the conductive elastomer 21 extends out of the connector 3, and installing the optical module 1 on the connector 3, where the golden finger 12 on the module circuit board 11 is in contact with the conductive elastomer 21 extending out of the connector 3.

In some embodiments, the conductive elastomer 21 may be first installed in the connector 3, and one end of the conductive elastomer 21 extends out of the connector 3, to be in contact with the golden finger 12. In this way, the connector 3 may be installed on the first surface of the host circuit board 2, and the module circuit board 11 of the optical module 1 is installed on the connector 3, so that the connector 3 is clamped between the host circuit board 2 and the module circuit board 11.

In comparison with that the module circuit board 11 is inserted into the connector 3, in this embodiment, a height of the connector 3 is small, the connector 3 is located only on the first surface of the module circuit board 11, and does not occupy space on the second surface of the module circuit board 11, so that another component may be installed in the space on the second surface of the module circuit board 11, and the connector 3 does not affect disposing of an air duct that passes through one end to the other end.

In some embodiments, the optoelectronic component manufactured in the foregoing method may include an optical module and a host circuit board. The optical module includes a module circuit board and a golden finger, and the golden finger is located on a first surface of the module circuit board. The host circuit board includes a conductive elastomer corresponding to the golden finger, and the conductive elastomer is located on a first surface of the host circuit board. The module circuit board of the optical module is installed on the host circuit board, the first surface of the module circuit board and the first surface of the host circuit board face each other, so that the golden finger is in contact with the conductive elastomer, to implement electrical connection between the optical module and the host circuit board. It can be learned that, the golden finger is disposed on one surface of the module circuit board, and the conductive elastomer is disposed on one surface of the host circuit board. In comparison with that the conductive elastomers are disposed on two surfaces of the host circuit board, height space occupied by the conductive elastomer in this application is small. When the height space occupied by the conductive elastomer is small, two opposite ends of the optical module may be disposed with an air duct that passes through the two opposite ends, and space is available on the module circuit board to install a heat sink, so that the heat dissipation effect of the optoelectronic component can be improved.

The foregoing descriptions are merely embodiments of this application, but are not intended to limit this application. Any modification, equivalent replacement, or improvement made without departing from the spirit and principle of this application should fall within the protection scope of this application.

What is claimed is:

1. An optoelectronic component comprising:
   a host circuit board comprising:
      a first host circuit board surface; and
      a conductive sheet located on the first host circuit board surface;
   an optical module comprising:
      a first end;
      a second end;

a module circuit board located on the host circuit board and comprising:

a first module circuit board surface, wherein the first module circuit board surface faces the first host circuit board surface; and a second module circuit board surface;

a gold finger in contact with the conductive sheet, wherein the gold finger is located on the first module circuit board surface; and an air duct located between and passing through the first end and the second end; and a heat sink located on the second module circuit board surface.

2. The optoelectronic component of claim 1, further comprising a thermally conductive layer disposed between the module circuit board and the heat sink.

3. The optoelectronic component of claim 1, further comprising:

a plurality of first rows of gold fingers on the first module circuit board surface; and a plurality of second rows of conductive sheets on the first host circuit board surface, wherein each of the first rows is in contact with one of the second rows.

4. The optoelectronic component of claim 1, wherein the host circuit board further comprises a connector, wherein the connector is located between the module circuit board and the host circuit board, and wherein the conductive sheet extends out of the connector and be in contact with the gold finger.

5. The optoelectronic component of claim 1, wherein the module circuit board further comprises a module circuit board end adjacent to the second end, and wherein the gold finger is located proximate to the second end.

6. The optoelectronic component of claim 1, wherein the optical module is an optical receiving component, an optical sending component, an optical transceiver component, or an optical forwarding component.

7. A network device comprising:

an optoelectronic component comprising:

a host circuit board comprising:

a first host circuit board surface; and a conductive sheet located on the first host circuit board surface;

an optical module comprising:

a first end;

a second end;

a module circuit board located on the host circuit board and comprising:

a first module circuit board surface, wherein the first module circuit board surface faces the first host circuit board surface; and a second module circuit board surface;

a gold finger in contact with the conductive sheet, wherein the gold finger is located on the first module circuit board surface; and an air duct located between and passing through the first end and the second end; and a heat sink located on the second module circuit board surface.

8. The network device of claim 7, further comprising a thermally conductive layer disposed between the module circuit board and the heat sink.

9. The network device of claim 7, if further comprising:

a plurality of first rows of gold fingers on the first module circuit board surface; and a plurality of second rows of conductive sheets on the first host circuit board surface, wherein each of the first rows is in contact with one of the second rows.

10. The network device of claim 7, wherein the host circuit board further comprises a connector, wherein the connector is located between the module circuit board and the host circuit board, and wherein the conductive sheet extends out of the connector and is in contact with the gold finger.

11. The network device of claim 7, wherein the module circuit board further comprises a module circuit board end, and wherein the gold finger is located proximate to the module circuit board end.

12. The network device of claim 7, wherein the optical module is an optical receiving component, an optical sending component, an optical transceiver integral component, or an optical forwarding component.

13. A method for manufacturing an optoelectronic component and comprising:

installing a gold finger on a first module circuit board surface of a module circuit board of an optical module that extends from a first end to a second end;

installing a heat sink on a second module circuit board surface of the module circuit board;

installing a conductive sheet on a first host circuit board surface of a host circuit board;

installing the optical module on the first host circuit board surface so that the first module circuit board surface faces the first host circuit board surface, and so that the gold finger is in contact with the conductive sheet; and disposing an air duct on the optical module so that the air duct is located between and passes through a first end of the optical module and a second end of the optical module.

14. The method of claim 13, further comprising installing a thermally conductive layer between the second module circuit board surface and the heat sink.

15. The method of claim 13, further comprising:

installing a connector on a second host circuit board surface of the host circuit board so that the conductive sheet is located in the connector and extends out of the connector; and further installing the optical module on the connector so that the gold finger is in contact with the connector.

16. The method of claim 13, further comprising:

installing a plurality of first rows of gold fingers on the first module circuit board surface;

installing a plurality of second rows of conductive sheets on the first host circuit board surface; and contacting each of the first rows with one of the second rows.

17. The method of claim 13, further comprising installing the gold finger proximate to a module circuit board end of the module circuit board that is adjacent to the second end.

18. The method of claim 13, wherein the optical module comprises an optical receiving component or an optical sending component.

19. The method of claim 13, wherein the optical module comprises an optical transceiver component.

20. The method of claim 13, wherein the optical module comprises an optical forwarding component.

* * * * *